(12) United States Patent
Rupp et al.

(10) Patent No.: US 10,643,897 B2
(45) Date of Patent: May 5, 2020

(54) METHOD OF FORMING A SEMICONDUCTOR DEVICE

(71) Applicant: Infineon Technologies AG, Neubiberg (DE)

(72) Inventors: Roland Rupp, Lauf (DE); Francisco Javier Santos Rodriguez, Villach (AT); Hans-Joachim Schulze, Taufkirchen (DE)

(73) Assignee: Infineon Technologies AG (DE)

(*) Notice: Subject to any disclaimer, the term of this patent is extended or adjusted under 35 U.S.C. 154(b) by 11 days.

(21) Appl. No.: 15/404,400

(22) Filed: Jan. 12, 2017

(65) Prior Publication Data

US 2017/0207124 A1  Jul. 20, 2017

(30) Foreign Application Priority Data

Jan. 14, 2016 (DE) .................. 10 2016 100 565

(51) Int. Cl.

| H01L 21/78 | (2006.01) |
|---|---|
| H01L 29/08 | (2006.01) |
| H01L 29/32 | (2006.01) |
| H01L 29/66 | (2006.01) |
| H01L 29/739 | (2006.01) |
| H01L 21/02 | (2006.01) |
| H01L 21/265 | (2006.01) |

(Continued)

(52) U.S. Cl.
CPC .... *H01L 21/7806* (2013.01); *H01L 21/02002* (2013.01); *H01L 21/265* (2013.01); *H01L 21/268* (2013.01); *H01L 21/322* (2013.01); *H01L 29/0834* (2013.01); *H01L 29/32* (2013.01); *H01L 29/66333* (2013.01); *H01L 29/66348* (2013.01); *H01L 29/7397* (2013.01); H01L 29/1608 (2013.01); H01L 29/66068 (2013.01); H01L 29/8611 (2013.01)

(58) Field of Classification Search
CPC .......................... H01L 21/7806; H01L 21/265
USPC .......................................................... 438/463
See application file for complete search history.

(56) References Cited

U.S. PATENT DOCUMENTS

| 6,284,671 B1* | 9/2001 | Schmuki ............. H01L 21/3063 257/E21.216 |
| 2004/0109328 A1* | 6/2004 | Dahl ....................... C23C 16/27 362/555 |

(Continued)

*Primary Examiner* — Mohammad M Choudhry
(74) *Attorney, Agent, or Firm* — Design IP

(57) ABSTRACT

Methods of forming a semiconductor device are provided. A method includes introducing impurities into a part of a semiconductor substrate at a first surface of the semiconductor substrate by ion implantation, the impurities being configured to absorb electromagnetic radiation of an energy smaller than a bandgap energy of the semiconductor substrate. The method further includes forming a semiconductor layer on the first surface of the semiconductor substrate. The method further includes irradiating the semiconductor substrate with electromagnetic radiation configured to be absorbed by the impurities and configured to generate local damage of a crystal lattice of the semiconductor substrate. The method further includes separating the semiconductor layer and the semiconductor substrate by thermal processing of the semiconductor substrate and the semiconductor layer, where the thermal processing is configured to cause crack formation along the local damage of the crystal lattice by thermo-mechanical stress.

30 Claims, 6 Drawing Sheets

(51) Int. Cl.
  *H01L 21/268*   (2006.01)
  *H01L 21/322*   (2006.01)
  *H01L 29/16*    (2006.01)
  *H01L 29/861*   (2006.01)

(56) References Cited

U.S. PATENT DOCUMENTS

| | | | |
|---|---|---|---|
| 2007/0217458 A1* | 9/2007 | Kitano | B82Y 20/00 |
| | | | 372/43.01 |
| 2009/0283866 A1* | 11/2009 | Schulze | H01L 21/22 |
| | | | 257/607 |
| 2011/0045612 A1* | 2/2011 | Kelman | G01J 3/42 |
| | | | 438/7 |
| 2012/0119336 A1 | 5/2012 | Akiyama | |
| 2012/0199956 A1* | 8/2012 | Lecomte | H01L 21/02032 |
| | | | 257/629 |
| 2012/0241919 A1 | 9/2012 | Mitani | |
| 2015/0200129 A1 | 7/2015 | Konishi et al. | |
| 2015/0229108 A1* | 8/2015 | Steigerwald | H01S 5/4093 |
| | | | 372/45.01 |
| 2015/0371871 A1* | 12/2015 | Schulze | H01L 21/3221 |
| | | | 257/655 |
| 2016/0372893 A1* | 12/2016 | McLaurin | H01S 5/4093 |
| 2017/0194148 A1* | 7/2017 | Breymesser | H01L 21/02675 |

* cited by examiner

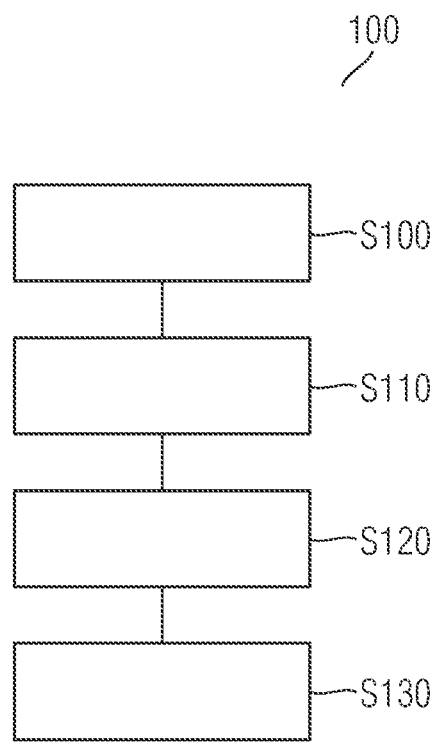

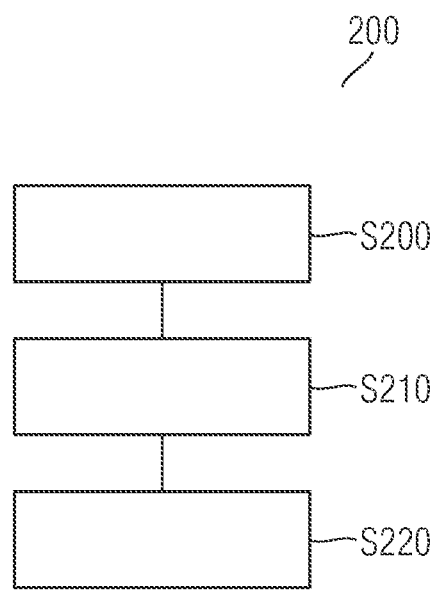

METHOD OF FORMING A SEMICONDUCTOR DEVICE

BACKGROUND

Semiconductor processing technologies aim at a precise setting of a wafer thickness. In insulated gate bipolar transistors (IGBTs) a precise setting of a target distance between a field stop zone and an emitter is essential for ensuring high short-circuit current capability, for example.

Therefore, it may be desirable to improve a method of manufacturing a semiconductor device by improving the setting of a semiconductor body thickness of the semiconductor device.

SUMMARY

The present disclosure relates to a method of forming a semiconductor device. The method includes introducing impurities into a part of a semiconductor substrate at a first surface of the semiconductor substrate by ion implantation, the impurities being configured to absorb electromagnetic radiation of an energy smaller than a bandgap energy of the semiconductor substrate. The method further includes forming a semiconductor layer on the first surface of the semiconductor substrate. The method further comprises irradiating the semiconductor substrate with electromagnetic radiation configured to be absorbed by the impurities and configured to generate a local damage of a crystal lattice of the semiconductor substrate. The method further includes separating the semiconductor layer and the semiconductor substrate by thermal processing of the semiconductor substrate and the semiconductor layer, the thermal processing configured to cause crack formation along the local damage of the crystal lattice by thermo-mechanical stress.

The present disclosure relates to another method of forming a semiconductor device. The method includes forming a semiconductor layer on the first surface of a semiconductor substrate, wherein impurities are introduced into a first sub-layer adjoining the semiconductor substrate at a first surface of the semiconductor substrate, the impurities being configured to absorb electromagnetic radiation of an energy smaller than a bandgap energy of the semiconductor substrate. The method further includes irradiating the semiconductor substrate with electromagnetic radiation configured to be absorbed by the impurities and configured to generate a local damage of a crystal lattice of the semiconductor substrate. The method further includes separating the semiconductor layer and the semiconductor substrate by thermal processing of the semiconductor substrate and the semiconductor layer, the thermal processing configured to cause crack formation along the local damage of the crystal lattice by thermo-mechanical stress.

Those skilled in the art will recognize additional features and advantages upon reading the following detailed description and upon viewing the accompanying drawings.

BRIEF DESCRIPTION OF THE DRAWINGS

The accompanying drawings are included to provide a further understanding of the invention and are incorporated in and constitute a part of this specification. The drawings illustrate one or more embodiments and, together with the description, serve to explain principles of the invention. Other embodiments of the invention and intended advantages will be readily appreciated as they become better understood by reference to the following detailed description.

FIG. 1 is a schematic flow diagram for illustrating a method of manufacturing a semiconductor device according to one or more embodiments;

FIG. 2 is a schematic flow diagram for illustrating another method of manufacturing a semiconductor device according to one or more embodiments;

DETAILED DESCRIPTION

Figure 3A:
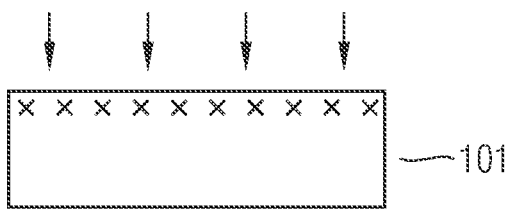
FIGS. 3A to 3G are cross-sectional views of a semiconductor body for illustrating processes of a method of manufacturing a semiconductor device according to one or more embodiments.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also FZ (Float-Zone) silicon wafers may be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti, Ta, W, Ru, Mo and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating (electroless or electrochemical), molding, Chemical Vapor Deposition (CVD), physical vapor deposition (PVD), evaporation, hybrid physical-chemical vapor deposition (HPCVD), printing etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in e.g. particular a rectangular pattern, to the semiconductor wafer, e.g., according to one or more of the above mentioned techniques, optionally carry out a grinding process, and then pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 100 of manufacturing a semiconductor device.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises introducing impurities into a part of a semiconductor substrate at a first surface of the semiconductor substrate by ion implantation, the impurities being configured to absorb electromagnetic radiation of an energy smaller than a bandgap energy of the semiconductor substrate. In some embodiments, the impurities are deep impurities requiring energies larger than three times the thermal energy at room temperature to ionize. For example, the deep impurities may have a distance to the bandgap of more than 100 meV, or even more than 150 meV. For a semiconductor substrate made of silicon, the impurities may be selected from the group of nitrogen (N), molybdenum (Mo), tungsten (W), tantalum (Ta), indium, or any combination thereof. For a semiconductor substrate made of silicon carbide, the impurities may be selected from the group of titanium (Ti), tantalum (Ta) and vanadium (V) or any combination thereof. In some embodiments, an extension of the impurities along a vertical direction between opposite surfaces of the semiconductor substrate is in a range of 100 nm to 3 µm. In some embodiments, a dose of the impurities is in a range of $1 \times 10^{13}$ cm$^{-2}$ to a crystal lattice amorphisation dose.

Process feature S110 comprises forming a semiconductor layer on the first surface of the semiconductor substrate. The semiconductor layer may be formed by an epitaxial layer formation process, for example by a chemical vapor deposition (CVD) process. The semiconductor layer may include one or more sub-layers subsequently formed on each other. Doping of the semiconductor layer or of the semiconductor sub-layers may be carried out in-situ during layer deposition/growth or be carried out by ion implantation and/or diffusion from a diffusion source. By way of example, when forming a super-junction structure in the semiconductor layer, the so-called multi-epitaxial growth technique may be applied where epitaxial growth of sub-layers and masked ion implantations are repeated alternately until a certain drift-layer thickness is achieved. During the epitaxial process the previously implanted species may be incorporated in the crystal lattice of the semiconductor substrate and occupy the desired energy level within the band gap.

Process feature S120 comprises irradiating the semiconductor substrate with electromagnetic radiation configured to be absorbed by the impurities and configured to generate a local damage of a crystal lattice of the semiconductor substrate. The local damage of the crystal lattice is caused by the local heating of the crystal lattice due to absorption of the electromagnetic radiation that may lead to a local weakening and/or modification of the crystal lattice, for example micro-cracks. The local damage is a crack-initiating area having a fracture strength that is locally reduced at or around the impurities compared to un-damaged parts of the semiconductor layer or semiconductor substrate. The impurities causing the local damage by absorption of the radiation are vertically self-aligned with respect to the semiconductor layer and irradiation of the semiconductor layer may also be carried out without focusing the irradiation beam at a certain plane within the semiconductor layer/semiconductor substrate. In some embodiments, the electromagnetic radiation is laser light. An energy density of electromagnetic radiation may be adapted to the absorption behavior of the impurities and set high enough, for example by intensity and duration of radiation, to a value within a range of 1 J/cm$^2$ and 5 J/cm$^2$. In some embodiments, radiation is incident on a surface of the semiconductor layer. Low doping of the semiconductor layer may be beneficial in regard to suppression or reduction of undesired absorption of the radiation through the semiconductor layer. In addition to or as an alternative to radiation incident on a surface of the semiconductor layer, the radiation may also be incident on a surface of the semiconductor substrate opposite to a surface where the semiconductor layer is located. Low doping of the semiconductor substrate, for example substrate doping concentrations smaller than $10^{14}$ cm$^{-3}$, thinning of the semiconductor substrate prior to radiation by mechanical and/or chemical processes such as machining, etching, cleaning, plasma treatment, and usage of undoped and/or semi-insulating substrates may be beneficial in regard to suppression or reduction of undesired absorption of the radiation through the semiconductor substrate.

Process feature S130 comprises separating the semiconductor layer and the semiconductor substrate by thermal processing of the semiconductor substrate and the semiconductor layer, where the thermal processing is configured to cause crack formation along the local damage of the crystal lattice by thermo-mechanical stress. Introduction of the thermo-mechanical stress may be based on expansion coefficient differences of a semiconductor material and another material formed on the first or the opposite surface of the semiconductor material. One example is known as the so-called "Cold Split" process utilizing a polymer coating on the surfaces of the semiconductor material followed by a pre-cooling and cooling process for introducing the thermo-mechanical stress. This causes a crack to expand from the local damage in the crack-initiating area along a cracking line, and leads to the separation of the semiconductor layer and the semiconductor substrate by splitting.

FIG. 2 is a schematic flow diagram for illustrating a method 200 of manufacturing a semiconductor device.

It will be appreciated that while method 200 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases. Also, one or more of the acts depicted herein may be carried out in one or more separate act and/or phases. Details on process features S100, S110, S120, S130, apply likewise to process features S200, S210, S220 below.

Process feature S200 comprises forming a semiconductor layer on the first surface of a semiconductor substrate, wherein impurities are introduced into a first sub-layer adjoining the semiconductor substrate at a first surface of the semiconductor substrate, the impurities being configured to absorb electromagnetic radiation of an energy smaller than a bandgap energy of the semiconductor substrate. Other than process feature S100 depicted in FIG. 1, the impurities are introduced into a seeding layer and/or lower or lowermost layer of a functional semiconductor layer grown on the semiconductor substrate. The functional semiconductor layer may act as a drift zone of a semiconductor device formed therein, for example.

Process feature S210 comprises irradiating the semiconductor substrate with electromagnetic radiation configured to be absorbed by the impurities and configured to generate a local damage of a crystal lattice of the semiconductor substrate.

Process feature S220 comprises separating the semiconductor layer and the semiconductor substrate by thermal processing of the semiconductor substrate and the semiconductor layer, the thermal processing configured to cause crack formation along the local damage of the crystal lattice by thermo-mechanical stress.

The processes depicted in FIGS. 1 and 2 allow for a local damage of crystal lattice that is self-aligned along a vertical direction with respect to a semiconductor layer that is to be separated from a semiconductor substrate. The processes depicted in FIGS. 1 and 2 supersede focusing of the radiation to a reference plane and overcome misadjustment of the radiation caused by wafer-bow.

In some embodiments, the method further comprises, prior to separating the semiconductor layer and the semiconductor substrate by thermal processing or prior to irradiating the semiconductor substrate with electromagnetic radiation, forming semiconductor device elements in and/or on the semiconductor layer. The device elements may include semiconducting regions, for example p- and/or n-doped regions doped regions, insulating layers, for example gate and/or field dielectric(s) and/or interlayer dielectric(s) and conducting layers such as metal layer(s) for contacts and/or wirings, protection and/or passivation layer (s) such as imide. The semiconductor regions, for example a doped drain region, a doped source region, a doped body region, a doped anode region, a doped cathode region may be formed at the first surface by ion implantation and/or diffusion from a diffusion source, for example. A planar gate structure including a gate dielectric and a gate electrode or a gate structure including a gate dielectric and a gate electrode in a trench may be formed by thermal oxidation and/or layer deposition of the gate dielectric and layer deposition of a highly doped semiconductor, for example polycrystalline silicon and/or metal layer(s). Thus, processing of the semiconductor device at a surface of the semiconductor layer, for example a front surface of the semiconductor device, may be completed before separating the semiconductor layer and the semiconductor substrate by thermal processing. Thus, mechanical stability of a semiconductor body comprising the semiconductor layer and the semiconductor substrate may be utilized during wafer handling when processing the semiconductor elements at a surface of the semiconductor layer.

In some embodiments, the method further comprises maintaining the impurities as a recombination zone of the semiconductor device.

In some embodiments, the method further comprises reducing a thickness of the semiconductor substrate by removal of material of the semiconductor substrate prior to irradiating the semiconductor substrate with electromagnetic radiation configured to be absorbed by the impurities and configured to generate a local damage of a crystal lattice of the semiconductor substrate. Material removal for thinning the semiconductor substrate may be based on mechanical and/or chemical processes, for example one or more of machining, etching, cleaning, plasma treatment, chemical mechanical polishing (CMP). Thereby, absorption of subsequent radiation in the semiconductor substrate may be reduced.

In some embodiments, forming the semiconductor layer comprises forming a contact or emitter layer on a semiconductor region comprising the impurities, and forming a drift zone layer on the doped contact or emitter layer. A maximum doping concentration of the contact or emitter layer exceeds a maximum doping concentration of the drift zone layer by more than two orders of magnitude. The doped contact or emitter layer may be electrically connected at a rear side of the semiconductor layer after separation of the semiconductor layer and the semiconductor substrate by thermal processing, whereas gate and source regions may be electrically connected at a front side of the semiconductor layer opposite to the rear side. Thus, rear side contact or emitter processing is carried out prior to separation of the semiconductor layer and the semiconductor substrate. As an example, the doped contact or emitter layer may be formed on a seed layer for epitaxial growth on the semiconductor substrate.

In some embodiments, the method further comprises, after separating the semiconductor layer and the semiconductor substrate, forming a doped contact or emitter layer at a surface of the semiconductor layer exposed by separating the semiconductor layer and the semiconductor substrate. The doped contact or emitter layer may be formed by an ion implantation process in combination with a low temperature annealing process and/or a laser annealing process, for example.

In some embodiments, the method further comprises, after separating the semiconductor layer and the semiconductor substrate by thermal processing, preparing a surface of the semiconductor substrate exposed by the separation process for reuse as a base substrate. Examples of surface preparation include chemical and/or mechanical processes, for example polishing, chemical mechanical polishing (CMP) and/or chemical surface cleaning process(es).

In some embodiments, the method further comprises, prior to separating the semiconductor layer and the semiconductor substrate, mounting the semiconductor layer on a carrier. Thereby, mechanical stability of further processes after separation of the semiconductor layer and the semiconductor substrate can be improved.

FIGS. 3A to 3G are cross-sectional views of a semiconductor body for illustrating processes of a method of manufacturing a semiconductor device as depicted in FIG. 1 and/or FIG. 2. Details on process features described with reference to FIGS. 1 and 2 apply likewise.

Referring to the schematic cross-sectional view of FIG. 3A, impurities are introduced into a surface part of a semiconductor substrate 101 by ion implantation exemplified by arrows, the impurities being configured to absorb electromagnetic radiation of an energy smaller than a bandgap energy of the semiconductor substrate. The impurities are exemplified by symbol "x" in the surface part of the semiconductor substrate 101. The impurities may be introduced only into a part of a surface area of the semiconductor substrate 101, for example. By way of example, the impurities may be introduced into an inner portion of a surface area of the semiconductor substrate 101 leaving an outer portion such as a ring portion free of impurities. In some other embodiments, the impurities are introduced into an overall surface area of the semiconductor substrate 101.

Figure 3B:
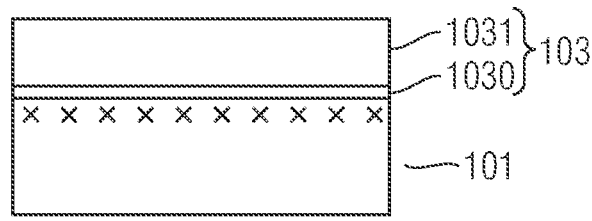

Referring to the schematic cross-sectional view of FIG. 3B, a semiconductor layer 103 is formed on the surface part of the semiconductor substrate 101, for example by an epitaxial growth process. The semiconductor layer 103 may comprise one or a plurality of sub-layers, for example a seeding layer 1030 and a functional semiconductor layer such as a drift zone layer 1031. Between the seeding layer 1030 and the drift zone layer 1031, additional functional layers such as a doped contact or emitter layer and/or a doped field stop zone layer may be arranged.

Figure 3C:
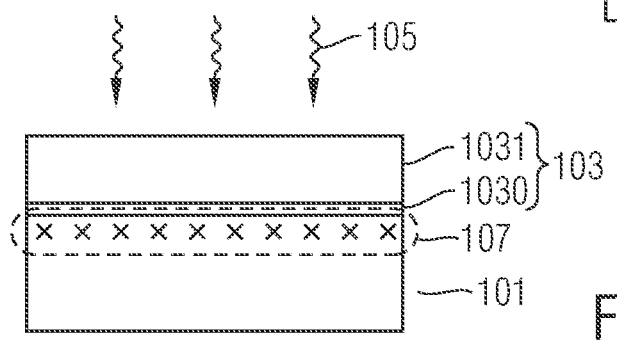

Referring to the schematic cross-sectional view of FIG. 3C, the semiconductor substrate 101 is irradiated with electromagnetic radiation 105 configured to be absorbed by the impurities and configured to generate a local damage of a crystal lattice of the semiconductor substrate. The radiation is incident on an exposed surface of the semiconductor layer 103. A boundary of an area of the local damage of the crystal lattice is illustrated by a dashed line 107 surrounding the impurities.

Figure 3D:
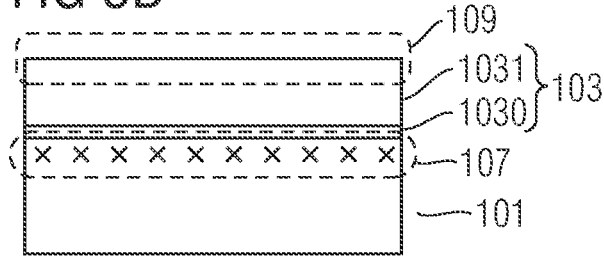

Referring to the schematic cross-sectional view of FIG. 3D, the semiconductor layer 103 is processed at an exposed surface by formation of semiconductor device elements as described above. The semiconductor device elements may be formed within or above the semiconductor layer 103 in an area 109.

Figure 3E:
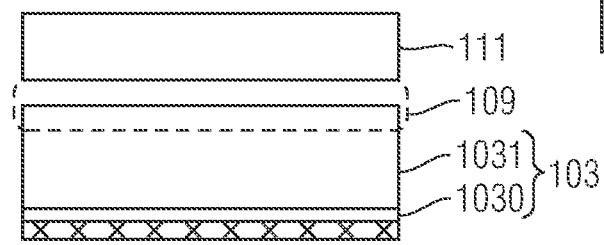

Referring to the schematic cross-sectional view of FIG. 3E, the semiconductor layer and the semiconductor substrate are separated by thermal processing of the semiconductor substrate and the semiconductor layer as described with reference to FIGS. 1 and 2. Depending upon a mechanical stability of the separated semiconductor layer 103, for example a thickness of the separated semiconductor layer 103, the semiconductor layer 103 may be mounted to a carrier 111 via the area 109 comprising the semiconductor device elements.

Figure 3F:
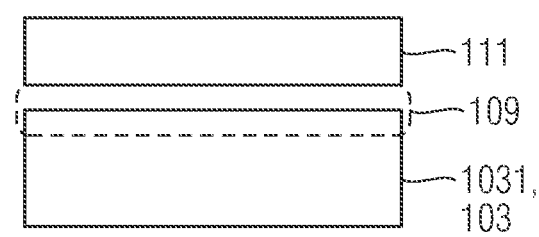

Referring to the schematic cross-sectional view of FIG. 3F, the semiconductor layer 103 is prepared at a surface exposed by the separation process. Preparation may include processes of cleaning, etching and machining, for example grinding and/or polishing removing the impurities and the seed layer 1030, for example. In some embodiments, the impurities and seed layer may remain as functional elements of the semiconductor device, for example as a recombination zone, for example.

Figure 3G:
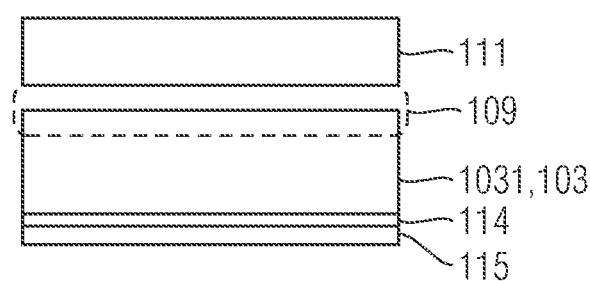

Referring to the schematic cross-sectional view of FIG. 3G, processes of forming doped semiconductor layer(s) 114 and contact layer(s) 115 at the exposed surface of the semiconductor layer 103 may follow. The doped semiconductor layer(s) may be one or more of a highly doped contact layer, an emitter layer, a field stop zone layer, for example. The contact layer(s) 115 may include one or more conductive layers such as metal layers or metal alloy layers or any combination thereof. Formation of all or part of the doped semiconductor layer(s) 114 may be omitted if these layers have been formed beforehand during formation of the semiconductor layer as depicted in FIG. 3B.

Figure 4:
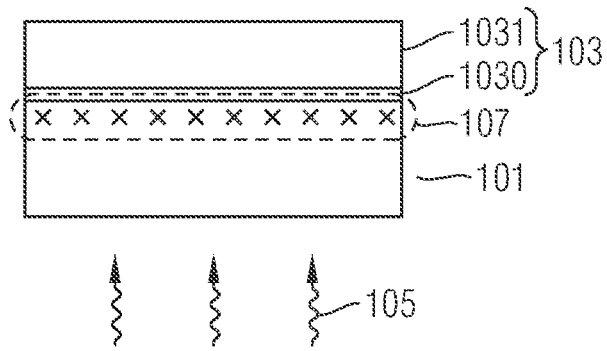
FIG. 4 is a cross-sectional view of a semiconductor body for illustrating a process that may replace the process of FIG. 3C according to one or more embodiments.

In another embodiment, the process of irradiating the semiconductor substrate 101 with electromagnetic radiation 105 is different from the process depicted in FIG. 3C in that the electromagnetic radiation 105 is incident on an exposed surface of the semiconductor substrate 101 as illustrated in the schematic cross-sectional view of FIG. 4.

In another embodiment of a method of manufacturing a semiconductor device, the processes depicted in FIGS. 3A to 3D are followed by processes as described below with reference to FIGS. 5A to 5C.

Figure 5A:
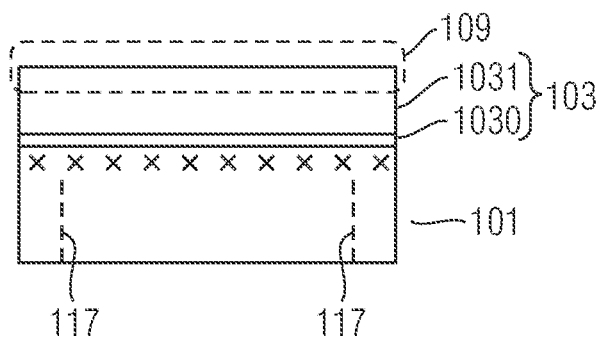
FIGS. 5A to 5C are cross-sectional views of a semiconductor body for illustrating processes that may follow the processes of FIGS. 3A to 3D according to one or more embodiments.

Referring to the schematic cross-sectional view of FIG. 5A, a ring structure 117 is cut in the semiconductor substrate from an exposed surface up to the impurities. The ring structure 117 may be cut by one or more of blade dicing (sawing), laser dicing, etching, for example. As an alternative and/or in addition to cutting of the ring structure 117, a grinding process may be applied to remove part of the semiconductor substrate within the ring structure, thereby reducing undesired parasitic absorption of the electromagnetic radiation 105 during subsequent radiation.

Figure 5B:
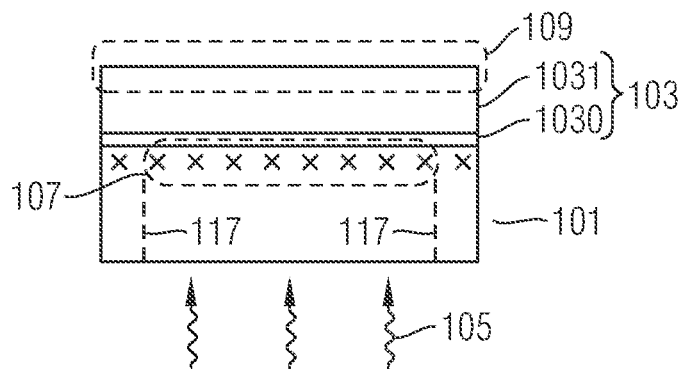
Figure 5C:
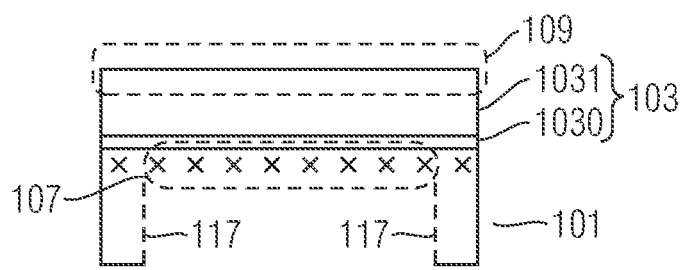

Referring to the schematic cross-sectional view of FIG. 5B, the electromagnetic radiation 105 is incident on an exposed surface of the semiconductor substrate 101 in an area inside of the ring structure 117. A boundary of an area of the local damage of the crystal lattice is illustrated by the dashed line 107 surrounding the impurities schematically depicted by "x".

Referring to the schematic cross-sectional view of FIG. 5C, the semiconductor layer 103 and a part of the semiconductor substrate 101 inside of the ring structure 117 are separated by thermal processing of the semiconductor substrate 101 and the semiconductor layer 103 as described with reference to FIGS. 1 and 2. A part of the semiconductor substrate 101 outside the ring structure 117 remains as a semiconductor substrate ring providing mechanical stability for further processes. Examples of further processes include processes of cleaning, etching and machining the exposed surface of the semiconductor substrate, for example grinding and/or polishing removing the impurities and the seed layer 1030, forming doped semiconductor layer(s) and contact layer(s) at the exposed surface of the semiconductor substrate 101. The doped semiconductor layer(s) may be one or more of a highly doped contact layer, an emitter layer, a field stop zone layer, for example. The contact layer(s) may include one or more conductive layers such as metal layers or metal alloy layers or any combination thereof. Formation of all or part of the doped semiconductor layer(s) may be omitted if these layers have been formed beforehand during formation of the semiconductor layer as depicted in FIG. 3B. A recess caused by removal of the part of the semiconductor substrate 101 inside the ring structure 117 may be filled with a conductive material, for example highly doped semiconductor material and/or metal for improving mechanical stability and electric contact to the semiconductor layer 103.

In some embodiments, the part of the semiconductor substrate 101 outside the ring structure 117 may be removed prior to applying the semiconductor wafer on a tape. Removal of the part of the semiconductor substrate 101 outside the ring structure 117 may be carried out by a separation process as described with reference to FIGS. 1 and 2, i.e. by introducing impurities into the semiconductor substrate outside the ring structure 117 and by separating that part from the semiconductor layer by the separation process described with reference to FIGS. 1 and 2.

Figure 6A:
FIGS. 6A and 6B are cross-sectional views of a semiconductor body for illustrating processes that may follow the processes of FIGS. 3A to 3C according to one or more embodiments.

In another embodiment of a method of manufacturing a semiconductor device, the processes depicted in FIGS. 3A to 3C are followed by processes as described below with reference to FIGS. 6A to 6C.

Referring to the schematic cross-sectional view of FIG. 6A, the semiconductor layer 103 and the semiconductor substrate 101 are separated by thermal processing of the semiconductor substrate and the semiconductor layer as described with reference to FIGS. 1 and 2. A carrier for mechanical stability may be omitted in case the separated semiconductor layer provides sufficient mechanical stability. This allows for more flexible process technology since a rear side of the semiconductor device may be processed at any time and does not suffer from possible constraints of predetermined processing sequences to meet the thermal budgets required for each process.

Figure 6B:
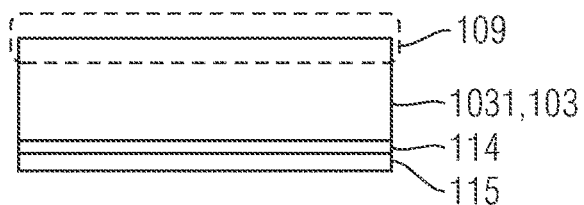
Figure 6C:
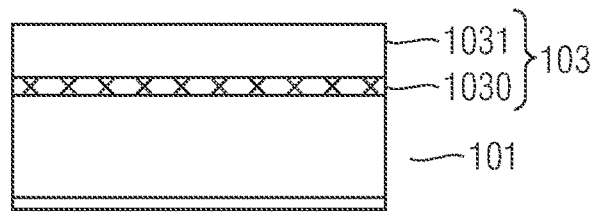
FIG. 6C is a schematic cross-sectional view of a semiconductor body for illustrating another method of manufacturing a semiconductor device according to one or more embodiments.

Referring to the schematic cross-sectional view of FIG. 6B, the semiconductor layer 103 is prepared at a surface exposed by the separation process. Preparation may include processes of cleaning, etching and machining, for example grinding and/or polishing removing the impurities and the seed layer 1030, for example. In some embodiments, the impurities and seed layer may remain as functional elements of the semiconductor device, for example as a recombination zone, for example. Processes of forming the doped semiconductor layer(s) 114 and the contact layer(s) 115 at the exposed surface of the semiconductor layer 103 may follow. The doped semiconductor layer(s) may be one or more of a highly doped contact layer, an emitter layer, a field stop zone layer, for example. The contact layer(s) 115 may include one or more conductive layers such as metal layers or metal alloy layers or any combination thereof. Formation of all or part of the doped semiconductor layer(s) 114 may be omitted if these layers have been formed beforehand during formation of the semiconductor layer as depicted in FIG. 3B. Processing at a surface opposite to the surface exposed by the separation process may be carried out before, and/or alternately, and/or after processing at the surface exposed by the separation process. Processing at a surface opposite to the surface exposed by the separation process may include formation of semiconductor device elements as described above. The semiconductor device elements may be formed within or above the semiconductor layer 103 in the area 109.

In the embodiments illustrated in FIGS. 3A to 6B, the impurities are introduced into a surface area of the semiconductor substrate. According to another embodiment, the impurities may be introduced into a lower or lowermost sub-layer of the semiconductor body 103, for example into the seeding layer 1030, see cross-sectional view of FIG. 6C, or into any other sub-layer between the drift zone layer 1031 and the semiconductor substrate 101. Other processes illustrated in FIGS. 3A to 6B apply likewise.

The methods of forming semiconductor devices as depicted in FIGS. 1 to 6C may result in semiconductor devices as described with reference to FIGS. 7A to 7D below.

Figure 7A:
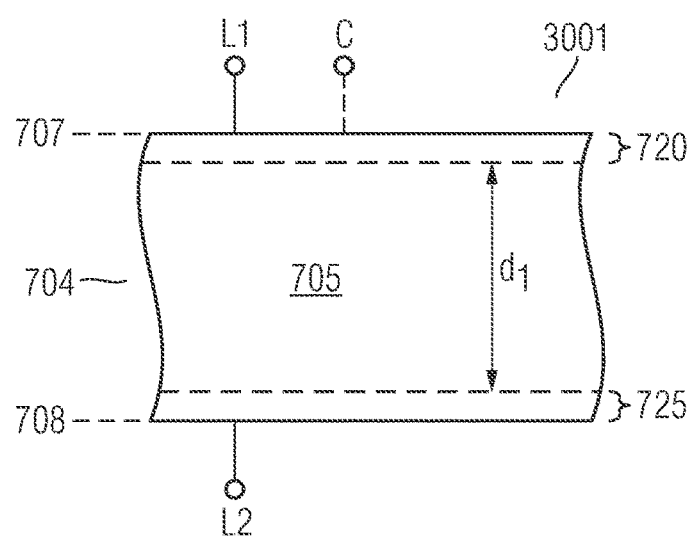
FIGS. 7A to 7D are schematic cross-sectional views of a semiconductor body for illustrating semiconductor devices manufactured by processes of FIGS. 1 to 6B according to one or more embodiments.

FIG. 7A is a schematic cross-sectional view 7001 of a portion of a vertical semiconductor device according to an embodiment. The vertical semiconductor device comprises a semiconductor body 704, for example a silicon semiconductor body or a silicon carbide semiconductor body. Precise adjustment of a thickness $d_1$ of a drift zone of the semiconductor body 704 includes process features described above with reference to FIGS. 1 to 6C.

The vertical semiconductor device includes a first load terminal structure 720 at a first surface 707, e.g. front surface of the semiconductor body 704. The first load terminal structure 720 includes doped semiconductor region(s). The doped semiconductor region(s) may be formed by doping processes of the semiconductor body 704 at the first surface 707, e.g. by diffusion and/or ion implantation processes. The doped semiconductor region(s) in the semiconductor body 704 of the first load terminal structure 720 may include doped source and body regions of a vertical power insulated gate field-effect transistors (IGFET), for example a superjunction field-effect transistors (FET) or of a collector of an insulated-gate bipolar transistor (IGBT), or of an anode or cathode region of a vertical power semiconductor diode or thyristor, for example. In the course of processing the semiconductor body 704 at the first surface 707, depending on the power semiconductor device to be formed in the semiconductor body, a control terminal structure such as a planar gate structure and/or a trench gate structure including gate dielectric(s) and gate electrode(s) may be formed.

The vertical semiconductor device further includes a second load terminal structure 725 at a second surface 708, e.g. a rear surface of the semiconductor body 704 opposite to the first surface 707. The second load terminal structure 725 includes doped semiconductor region(s). The doped semiconductor region(s) may be formed by doping processes of the semiconductor body 704 at the second surface 708, e.g. by diffusion and/or ion implantation processes. The doped semiconductor region(s) in the semiconductor body 704 of the second load terminal structure 725 may include doped field stop region(s), doped drain regions of a vertical power FET, or an emitter of an IGBT, or an anode or cathode region of a vertical power semiconductor diode, for example. The implanted ions may be "activated", i.e. incorporated into the crystal lattice in region 725 by a thermal annealing step (e.g. melting or non-melting laser annealing from the back surface after implantation).

A first electrical load terminal contact L1 to the first load terminal structure 720 and an electrical control terminal contact C to a control terminal structure, if present in the vertical power semiconductor device, are part(s) of a wiring area above the first surface 707. A second electrical load contact L2 to the second load terminal structure 725 is provided at the second surface 708. The electrical load contacts L1, L2 and the electrical control terminal contact C may be formed of one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers and/or active area(s) in the silicon semiconductor body such as the first load terminal structure 720, for example. The patterned conductive layer(s) and interlevel dielectric layer(s) may form the wiring area above the semiconductor body 704 at the first surface 707, for example. A conductive layer, e.g. a metallization layer or metallization layer stack may be provided at the second surface 708, for example.

In the vertical semiconductor device illustrated in FIG. 7A, a current flow direction is between the first and second load terminal contacts L1, L2 along a vertical direction between the opposite first and second surfaces 707, 708.

Figure 7B:
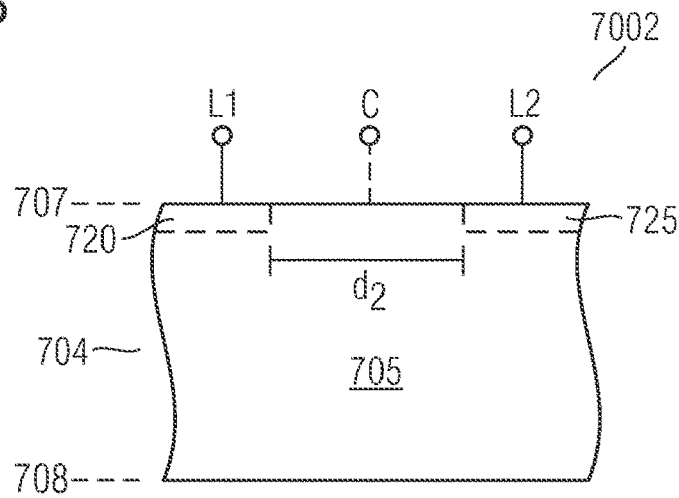

FIG. 7B is a schematic cross-sectional view 7002 of a portion of a lateral semiconductor device according to an embodiment. The lateral semiconductor device differs from the vertical semiconductor device in that the second load terminal structure 725 and the second load terminal contact L2 are formed at the first surface 707. The first and second load terminal structures 720, 725 may be formed simultaneously by same processes. Likewise, the first and second load terminal contacts L1, L2 may be formed simultaneously by same processes.

In the embodiments illustrated in FIGS. 7A and 7B, a blocking voltage capability of the vertical and lateral semiconductor devices can be adjusted by appropriate distances d1, d2 of a drift or base zone 705 between the first and second load terminal structures 720, 725, for example between a body region and a drain region of a FET.

Figure 7C:
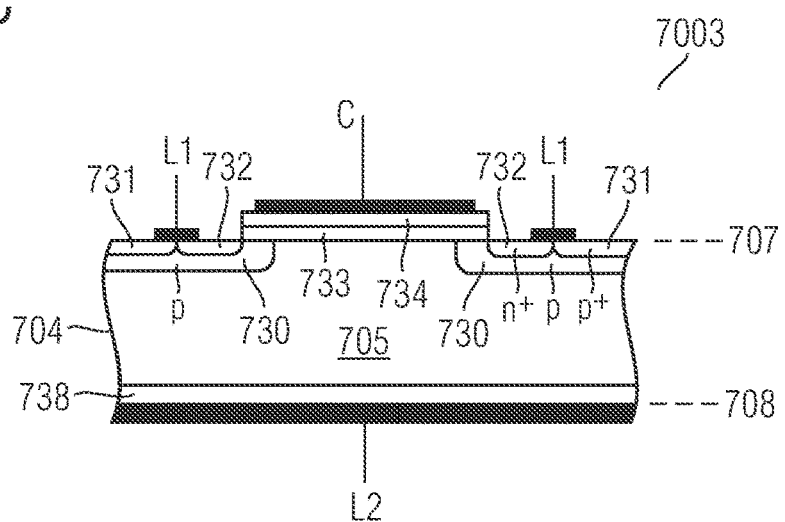

In the schematic cross-sectional view 7003 of FIG. 7C, the semiconductor device manufactured based on the processes illustrated in FIGS. 1 to 6C is a planar gate transistor comprising a p-doped body region 730, a $p^+$-doped body contact region 731 and an $n^+$-doped source region 732. A gate dielectric 733 electrically isolates a gate electrode 734 from the drift or base zone 705. The gate electrode 734 is electrically connected to the control terminal contact C. In some embodiments, the gate electrode 734 corresponds to the control terminal contact C. The first load terminal contact L1, for example an emitter terminal contact is electrically connected to the p-doped body region 730 and to the $n^+$-doped source region 732. A highly doped region 738, for example a $p^+$-doped bipolar injection region of an IGBT or an $n^+$-doped drain contact region of an IGFET at the second surface 708 is electrically connected to the second load terminal contact L2, for example a collector terminal contact.

Figure 7D:
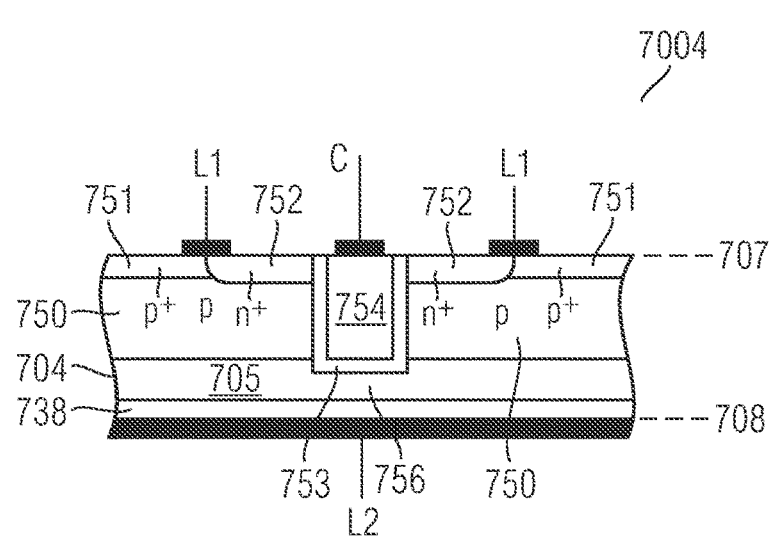

In the schematic cross-sectional view 7004 of FIG. 7D, the semiconductor device manufactured based on the processes illustrated in FIGS. 1 to 6C is a trench gate transistor comprising a p-doped body region 750, a $p^+$-doped body contact region 751 and an $n^+$-doped source region 752. A gate dielectric 753 in a trench 756 electrically isolates a gate electrode 754 from the drift or base zone 705. The gate electrode 754 is electrically connected to the control terminal contact C. In some embodiments, the gate electrode 754 corresponds to the control terminal contact C. The first load terminal contact L1, for example a source terminal contact is electrically connected to the p-doped body region 750 and to the $n^+$-doped source region 752. The highly doped region 738, for example a $p^+$-doped bipolar injection region of an IGBT or an $n^+$-doped drain contact region of an IGFET at the second surface 708 is electrically connected to the second load terminal contact L2, for example a collector terminal contact. In addition to the gate dielectric 753 and the gate electrode 754, one or more field dielectric(s) and field electrode(s) may be arranged in the trench 756, for example between the gate electrode 754 and a bottom side of the trench.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device, the method comprising:
    forming a semiconductor layer on a first surface of a semiconductor substrate, wherein impurities are introduced into a first sub-layer adjoining the semiconductor substrate at the first surface of the semiconductor substrate, the impurities being configured to absorb electromagnetic radiation of an energy smaller than a bandgap energy of the semiconductor substrate;
    irradiating the semiconductor substrate with electromagnetic radiation, the electromagnetic radiation being absorbed by the impurities thereby generating a local damage of a crystal lattice of the semiconductor substrate; and
    subsequent to and independent from irradiating the semiconductor substrate with the electromagnetic radiation, applying thermal processing to the semiconductor substrate and the semiconductor layer, including at the local damage, to regulate a temperature thereof, wherein the thermal processing is configured to cause a crack formation along the local damage of the crystal lattice by thermo-mechanical stress; and
    separating the semiconductor layer and the semiconductor substrate by the thermal processing of the semiconductor substrate and the semiconductor layer.

2. A method of forming a semiconductor device, the method comprising:
    introducing impurities into a part of a semiconductor substrate at a first surface of the semiconductor substrate by ion implantation, the impurities being configured to absorb electromagnetic radiation of an energy smaller than a bandgap energy of the semiconductor substrate;
    forming a semiconductor layer on the first surface of the semiconductor substrate;
    irradiating the semiconductor substrate with electromagnetic radiation, the electromagnetic radiation being absorbed by the impurities thereby generating a local damage of a crystal lattice of the semiconductor substrate; and
    subsequent to and independent from irradiating the semiconductor substrate with the electromagnetic radiation, applying thermal processing to the semiconductor substrate and the semiconductor layer, including at the local damage, to regulate a temperature thereof, wherein the thermal processing is configured to cause a crack formation along the local damage of the crystal lattice by thermo-mechanical stress; and
    separating the semiconductor layer and the semiconductor substrate by the thermal processing of the semiconductor substrate and the semiconductor layer.

3. The method of claim 2, wherein the electromagnetic radiation is laser light.

4. The method of claim 2, wherein an energy density of the electromagnetic radiation is in a range of 1 J/cm2 and 5 J/cm2.

5. The method of claim 2, wherein an extension of the impurities along a vertical direction between opposite surfaces of the semiconductor substrate is in a range of 100 nm to 3 μm.

6. The method of claim 2, wherein a dose of the impurities is in a range of 1×1013 cm-2 to a crystal lattice amorphisation dose.

7. The method of claim 2, wherein the semiconductor layer is a silicon semiconductor layer and the impurities are selected from the group of nitrogen, molybdenum, tungsten, tantalum, indium and any combination thereof.

8. The method of claim 2, wherein the semiconductor layer is a silicon carbide semiconductor layer and the impurities are selected from the group of titanium, tantalum, vanadium and any combination thereof.

9. The method of claim 2, wherein the impurities are deep impurities having a distance to a closest bandgap of more than 100 meV.

10. The method of claim 2, further comprising maintaining the impurities as recombination centers in a recombination zone of the semiconductor device.

11. The method of claim 2, further comprising reducing a thickness of the semiconductor substrate by removal of material of the semiconductor substrate prior to irradiating the semiconductor substrate with the electromagnetic radiation configured to be absorbed by the impurities and configured to generate the local damage of the crystal lattice of the semiconductor substrate.

12. The method of claim 11, wherein the thickness is reduced only in the part of the semiconductor substrate.

13. The method of claim 2, wherein forming the semiconductor layer comprises forming a contact layer or an emitter layer on a semiconductor region comprising the impurities, and forming a drift zone layer on the contact layer or the emitter layer, wherein a maximum doping concentration of the contact layer or the emitter layer exceeds a maximum doping concentration of the drift zone layer by more than two orders of magnitude.

14. The method of claim 2, further comprising, after separating the semiconductor layer and the semiconductor substrate, forming a doped contact layer or a doped emitter layer at a surface of the semiconductor layer exposed by separating the semiconductor layer and the semiconductor substrate.

15. The method of claim 2, further comprising, prior to separating the semiconductor layer and the semiconductor substrate by thermal processing or prior to irradiating the semiconductor substrate with electromagnetic radiation, forming semiconductor device elements in and/or on the semiconductor layer.

16. The method of claim 2, further comprising, after separating the semiconductor layer and the semiconductor substrate by thermal processing, preparing a surface of the semiconductor substrate, exposed by separating the semiconductor layer and the semiconductor substrate, for reuse as a base substrate.

17. The method of claim 2, further comprising, prior to separating the semiconductor layer and the semiconductor substrate, mounting the semiconductor layer on a carrier.

18. The method of claim 2, wherein the semiconductor device is a vertical power semiconductor device, and the method further comprises:
forming a first load terminal and a control terminal at a first surface of the semiconductor layer; and
forming a second load terminal at a second surface of the semiconductor layer opposite to the first surface of the semiconductor layer.

19. The method of claim 2, further comprising cutting a ring structure in the semiconductor substrate from a second surface of the semiconductor substrate, and wherein the semiconductor layer and the semiconductor substrate are separated only within an inner area of the ring structure.

20. The method of claim 19, further comprising reducing a thickness of the semiconductor substrate by removal of a material of the semiconductor substrate within the inner area of the ring structure.

21. The method of claim 1, wherein the semiconductor layer includes a drift layer, the method further comprising:
forming a semiconductor device element at least partly at the drift layer of the semiconductor layer.

22. The method of claim 2, wherein the semiconductor layer includes a drift layer, the method further comprising:
forming a semiconductor device element at least partly at the drift layer of the semiconductor layer.

23. The method of claim 22, wherein the semiconductor device element is formed prior to separating the semiconductor layer and the semiconductor substrate by thermal processing.

24. The method of claim 22, wherein the semiconductor layer includes a first surface coupled to the first surface of the semiconductor substrate and a second surface opposite to the first surface of the semiconductor layer, the second surface of the semiconductor layer being a surface of the drift layer, and the semiconductor device element is formed at least partially at the second surface of the semiconductor layer.

25. The method of claim 1, wherein the thermal processing is applied from outside the semiconductor substrate and the semiconductor layer, independent of the electromagnetic radiation, to induce a temperature change at the local damage.

26. The method of claim 25, wherein the thermal processing includes a cooling process for introducing the thermo-mechanical stress to cause the crack formation.

27. The method of claim 25, wherein the thermal processing includes a heating process for introducing the thermo-mechanical stress to cause the crack formation.

28. The method of claim 2, wherein the thermal processing is applied from outside the semiconductor substrate and the semiconductor layer, independent of the electromagnetic radiation, to induce a temperature change at the local damage.

29. The method of claim 28, wherein the thermal processing includes a cooling process for introducing the thermo-mechanical stress to cause the crack formation.

30. The method of claim 28, wherein the thermal processing includes a heating process for introducing the thermo-mechanical stress to cause the crack formation.

* * * * *